(12) United States Patent
de Bock et al.

(10) Patent No.: US 8,976,525 B2
(45) Date of Patent: Mar. 10, 2015

(54) SYSTEMS AND METHODS FOR DISSIPATING HEAT IN AN ENCLOSURE

(75) Inventors: Hendrik Pieter Jacobus de Bock, Clifton Park, NY (US); William Earl Gross, Jr., Grand Rapids, MI (US); Bryan Patrick Whalen, Gansevoort, NY (US); Robert Paul Meier, Conklin, MI (US)

(73) Assignee: General Electric Company, Niskayuna, NY (US)

( * ) Notice: Subject to any disclaimer, the term of this patent is extended or adjusted under 35 U.S.C. 154(b) by 442 days.

(21) Appl. No.: 13/562,336

(22) Filed: Jul. 31, 2012

(65) Prior Publication Data

US 2014/0034270 A1 Feb. 6, 2014

(51) Int. Cl.
*H05K 7/20* (2006.01)
*F28F 13/12* (2006.01)
*G06F 1/20* (2006.01)

(52) U.S. Cl.
USPC ...... 361/694; 361/679.47; 361/690; 361/695; 165/80.2; 165/80.3; 165/104.33; 165/122

(58) Field of Classification Search
CPC ............. H05K 7/20; F24F 7/06; F25D 23/12; F28F 7/00; F28D 15/00; H01L 23/34; H01L 41/00; F04B 17/00; B05B 1/08; H02J 7/00
USPC ......... 361/679.46–679.5, 688–697, 714, 715, 361/719, 721; 165/47, 54, 55, 80.2, 80.3, 165/104.33, 104.34, 121–126, 185; 417/413.1, 413.2, 410.2, 437; 312/223.1, 223.2, 223.3, 236
See application file for complete search history.

(56) References Cited

U.S. PATENT DOCUMENTS

| | | | |
|---|---|---|---|
| 5,088,005 A | 2/1992 | Ciaccio | |
| 5,327,744 A | 7/1994 | Frawley et al. | |
| 5,701,755 A | 12/1997 | Severson et al. | |
| 7,193,850 B2 | 3/2007 | Pal | |
| 7,365,974 B2 | 4/2008 | Hartung | |
| 7,397,164 B1 * | 7/2008 | Ali | 310/311 |
| 7,911,796 B2 | 3/2011 | Vander Ploeg et al. | |
| 7,990,705 B2 * | 8/2011 | Bult et al. | 361/694 |
| 8,023,267 B2 | 9/2011 | Streyle et al. | |
| 8,059,409 B2 | 11/2011 | Steenwyk et al. | |
| 2005/0011212 A1 * | 1/2005 | Bistekos | 62/259.2 |
| 2007/0141453 A1 * | 6/2007 | Mahalingam et al. | 429/120 |
| 2008/0174620 A1 | 7/2008 | Tanner | |
| 2011/0114287 A1 * | 5/2011 | Arik et al. | 165/67 |
| 2011/0186263 A1 | 8/2011 | Piesker | |
| 2012/0073788 A1 * | 3/2012 | Streyle | 165/104.34 |

OTHER PUBLICATIONS

C. Sarno et al.; "Integration, Cooling and Packaging Issues for Aerospace Equipments"; This paper appears in: Design, Automation & Test in Europe Conference & Exhibition ; Mar. 8-12, 2010; 6 Pages.

* cited by examiner

*Primary Examiner* — Michael V Datskovskiy
(74) *Attorney, Agent, or Firm* — Seema S. Katragadda

(57) ABSTRACT

An enclosure is presented. The enclosure includes an outer casing having one or more walls. Further, the enclosure includes a synthetic jet assembly configured to dissipate heat from the one or more walls, where the synthetic jet assembly includes a bracket operatively coupled to the one or more walls of the outer casing and two or more synthetic jets operatively coupled to the bracket, where the two or more synthetic jets are arranged in a multi-dimensional array.

16 Claims, 5 Drawing Sheets

SYSTEMS AND METHODS FOR DISSIPATING HEAT IN AN ENCLOSURE

BACKGROUND

Embodiments of the present disclosure relate generally to enclosures, and more particularly to systems and methods for thermal management of enclosures.

Enclosures, such as electronic chassis typically include multiple electronic devices enclosed in a metal casing. The metal casing, in some applications, hermetically seals the electronic devices, thereby protecting the electronic devices from the external environment. Such protection is often desirable because the chassis may be employed in rugged environments where temperatures may fluctuate from very hot to very cold. During operation, the electronic devices within the chassis may generate heat. However, as the chassis is hermetically sealed, these electronic devices may be unable to dissipate the heat effectively, and thereby their temperature may further increase. Such high temperatures within the chassis may increase the temperature of the electronic devices beyond their maximum reliable operating temperature. If the heat is not extracted, the electronic devices may underperform, shutdown, or get damaged. Therefore, to extract the heat from within the chassis, most electronic chassis include thermal conductive paths that conduct the heat away from the electronic devices and transport the heat to the metal casing. Once the heat is conducted by the metal casing, various thermal management techniques may be utilized to dissipate heat from the metal casing.

Thermal management techniques may be broadly divided into two categories—passive cooling and active cooling. In passive cooling, natural air convection is utilized for cooling the chassis. In active cooling, an auxiliary device such as a fan, cooling plate, or heat exchanger is utilized for cooling the chassis. In one example of a passive cooling technique, surface extending fins may be arranged on an outer surface of the metal casing to increase the surface area of the enclosure. The increased surface area may aid in dissipating the heat at a faster rate as compared to casings without fins. Alternatively, an active cooling technique may be employed, where a fan may be disposed along one or more walls of the metal casing to increase the airflow around the metal casing such that greater amount of heat is dissipated per unit time as compared to natural convection cooling.

Passive cooling is generally effective for low power applications or applications that operate in low temperature environments, but is often insufficient for high power applications or applications that operate in high temperature environments. Active cooling, on the other hand, is more efficient in high power and high temperature applications as the active devices may be controlled to dissipate a desired amount of heat. Unfortunately, in ruggedized applications such as in vehicles, active cooling is often not a desirable solution. For example, fan cooling is generally not employed in vehicles because fans include multiple ball bearings. While in motion, vehicles may experience excessive vibrations, which may damage the ball bearings relatively quickly. In addition, the environment may include sand and/or dust, which may penetrate the fan bearings resulting in premature wear and failure. If the fan fails mid-operation because of such wear, electronic devices within the chassis may overheat and shutdown. Such a shutdown may lead to loss in communication, sensor control, and the like. Therefore, in ruggedized chassis, passive air-cooling is used for cooling even though these passive cooling systems may hinder the performance of the electronic devices within the chassis.

BRIEF DESCRIPTION OF THE INVENTION

In accordance with aspects of the present disclosure, an enclosure is presented. The enclosure includes an outer casing having one or more walls. Further, the enclosure includes a synthetic jet assembly configured to dissipate heat from the one or more walls, where the synthetic jet assembly includes a bracket operatively coupled to the one or more walls of the outer casing and two or more synthetic jets operatively coupled to the bracket, where the two or more synthetic jets are arranged in a multi-dimensional array.

In accordance with another aspect of the present disclosure, a ruggedized enclosure is presented. The ruggedized enclosure includes an outer casing having an outer surface and one or more walls, where the outer casing includes an extended surface disposed on at least one of the one or more walls of the outer casing, and a synthetic jet assembly configured to dissipate heat from the extended surface, where the synthetic jet assembly is disposed adjacent to the extended surface. Further, the synthetic jet assembly includes a bracket coupled to the at least one of the one or more walls, and one or more synthetic jets operatively coupled to the bracket such that the one or more synthetic jets are disposed adjacent to the outer surface of the outer casing.

In accordance with yet another aspect of the present disclosure, a synthetic jet assembly is presented. The synthetic jet assembly includes a bracket. Furthermore, the synthetic jet assembly includes two or more synthetic jets coupled to the bracket, where the two or more synthetic jets are arranged in a multi-dimensional array.

In accordance with yet another aspect of the present disclosure, a method for dissipating heat from one or more walls of an enclosure is presented. The method includes mounting a synthetic jet assembly adjacent to an extended surface of the enclosure, where the synthetic jet assembly includes a bracket operatively coupled to the enclosure and one or more synthetic jets operatively coupled to the bracket such that the one or more synthetic jets are spaced apart from an outer surface of the enclosure. Further, the method includes generating a fluid jet from the one or more synthetic jets. Moreover, the method includes directing the fluid jet towards the one or more walls of the enclosure to dissipate the heat from the one or more walls.

BRIEF DESCRIPTION OF THE DRAWINGS

These and other features, aspects, and advantages of the present disclosure will be better understood when the following detailed description is read with reference to the accompanying drawings in which like characters represent like parts throughout the drawings, wherein.

DETAILED DESCRIPTION

Embodiments of the present disclosure employ passive cooling techniques to dissipate heat from electronic enclosures. More particularly, embodiments of the present disclosure employ synthetic jet assemblies for such heat dissipation. These assemblies may include a bracket to couple synthetic jets to one or more walls of the enclosure. With such an arrangement, the synthetic jets may be spaced apart from an outer surface the enclosure walls. This separation between the synthetic jets and the outer surface of the enclosure walls aids in isolating any vibrations experienced by the enclosure from the synthetic jets and vice-versa.

Figure 1:
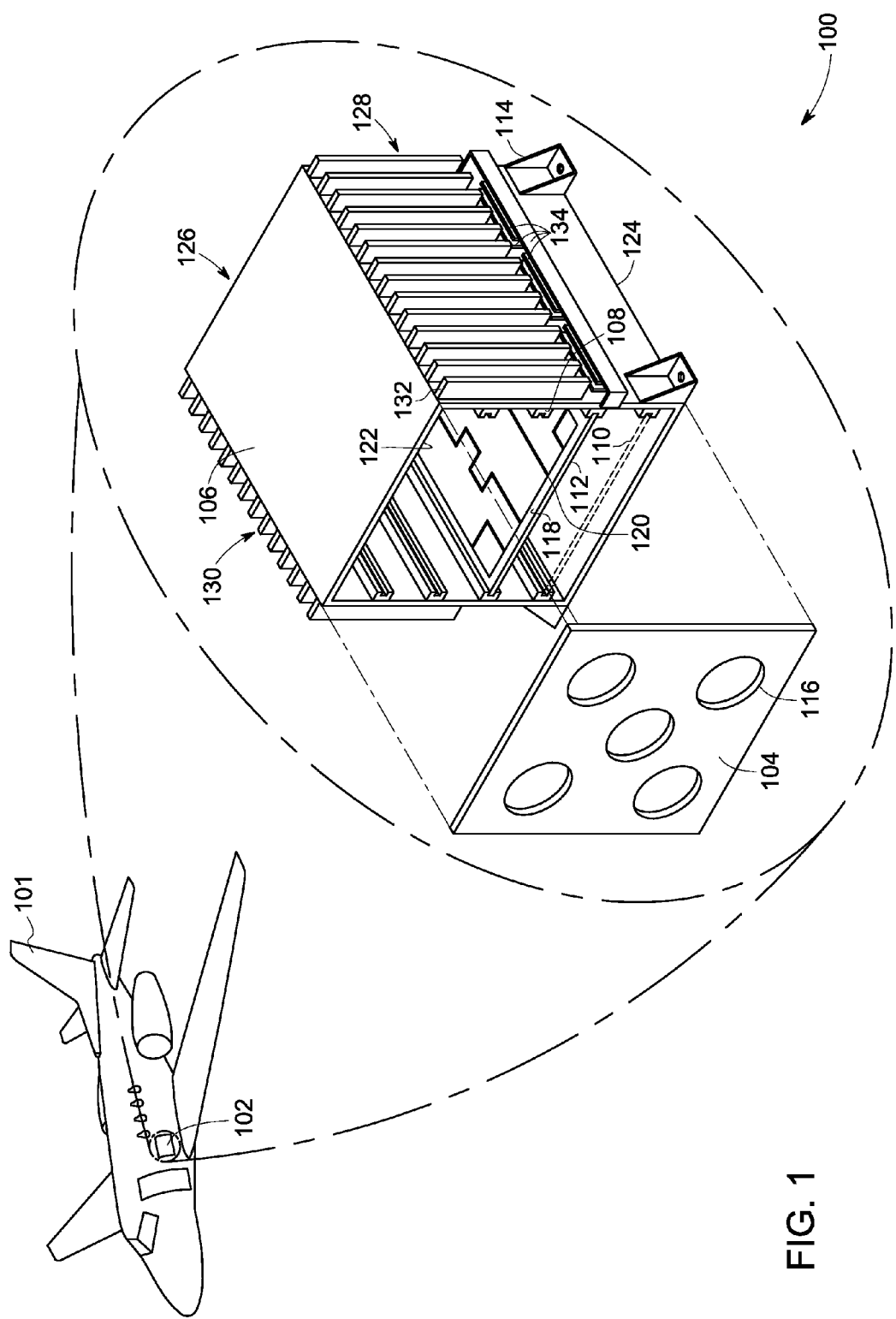
FIG. 1 is a diagrammatical representation of an aircraft that includes an enclosure having an exemplary synthetic jet assembly, according to aspects of the present disclosure.

Further, embodiments of the present disclosure will be described with reference to a ruggedized enclosure, such as an electronic chassis utilized in rugged applications. Rugged applications may include all types of vehicles including land, water, or air vehicles. However, it will be understood that embodiments of the present disclosure may be utilized in non-rugged applications as well. For example, these embodiments may find utility in chassis employed in desktop computers, servers, laptops, or in any other electronic devices such as LED devices without departing from the scope of the present disclosure. In FIG. 1, embodiments of the present disclosure are applied in an aircraft. Such implementation is not limiting. It will be appreciated that the exemplary enclosures and synthetic jet assemblies described in this disclosure may easily be implemented in other vehicles, such as tanks, trucks, trailers, cars, buses, boats, and ships without departing from the scope of the present disclosure.

FIG. 1 is a diagrammatical representation 100 of an exemplary aircraft 101 according to aspects of the present disclosure. The aircraft 101 may be a commercial aircraft, a military aircraft, a helicopter, an unmanned aircraft system, or any other rotating or fixed wing aircraft. To control various operations of the aircraft 101 such as monitoring the wheels, blades, or engines, or to control onboard systems such as lighting or oxygen supply, several electronic devices may be required. In certain examples, these electronic devices may be stored in a sealed environment within an enclosure 102 in the aircraft 101. In avionics, the enclosure 102 may be commonly referred to as an air transport rack (ATR) or an avionics chassis.

Furthermore, in FIG. 1, a zoomed-in view of the enclosure 102 is also illustrated. The enclosure 102 may include a removable front cover 104 and an outer casing 106 that defines an interior and an exterior of the enclosure 102. Furthermore, the enclosure 102 may include one or more thermally conductive card rails 108 that define/provide slots 110 for receiving electronic devices 112 such as printed circuit boards (PCBs). Mounting feet 114 may be provided to facilitate coupling the enclosure 102 to the aircraft 101 by means of bolts or other such fasteners. Moreover, the mounting feet 114 may function as an electrical ground for grounding the enclosure 102 to the frame of the aircraft 101.

In some embodiments, the removable front cover 104 may include one or more openings 116 that may be configured to receive one or more connectors for coupling the electronic devices 112 to other equipment (not shown) on the aircraft 101. The enclosure 102, when closed, may form a hermetically sealed environment for the electronic devices 112, guarding them from dust, radio waves, and other external environmental factors.

During operation, the electronic devices 112 may generate heat. However, as the enclosure 102 is hermetically sealed, heat generated by the electronic devices 112 may be trapped within the enclosure 102, further increasing the temperature within the enclosure 102. Such high heat environments may damage the electronic devices 112. To dissipate the heat from within the enclosure 102, the electronic devices 112 may be provided with conductive elements, which may conduct and transfer the heat to the card rails 108. One such conductive element may be thermally conductive side strips 118 that may be disposed along exterior edges of the electronic devices 112. Further, thermally conductive interior paths 120 may also be provided within the electronic devices 112. The interior paths 120 may aid in creating a thermally conductive path from the electronic device 112 to the thermally conductive side strips 118, thereby providing a direct thermal pathway from the interior to the periphery of the electronic devices 112. The side strips 118 may be configured to provide a thermal pathway from the periphery of the electronic devices 112 to the card rails 108. Alternatively, the conductive element may be a plate-like heat frame (not shown), such as an aluminum heat frame that may be mounted on the PCB of the electronic devices 112. Such a heat frame may include slots for the electronic components of the electronic devices 112. Heat from the electronic components may be conducted by the heat frame through conductive paths and transferred to the card rails 108. Subsequently, the heat may be conducted from the card rails 108 by the outer casing 106.

In addition, as illustrated in FIG. 1, the outer casing 106 may include a frame having a top wall 122, a bottom wall 124, a back wall 126, and opposing sidewalls 128 and 130. These walls collectively form the outer casing 106. Further, to increase the surface area of the outer casing 106, an extended surface such as a plurality of heat-dissipating fins 132 may be provided. These fins 132 may be configured to project from the walls of the outer casing 106. In the example of FIG. 1, the fins 132 are illustrated as projecting from the outer surface of sidewalls 128 and 130. However, it will be understood that the fins 132 may project from any wall of the outer casing 106 without departing from the scope of the present disclosure. Moreover, the fins 132 may extend along the entire length of a wall or along a portion of a wall without departing from the scope of the present disclosure.

Furthermore, although the fins 132 are illustrated as a one-dimensional array of rectangular plates, it will be understood that the fins 132 may be implemented in any other known manner. For example, the fins 132 may be designed in a V-groove plate configuration or a U-groove plate configuration without departing from the scope of the present disclosure. Moreover, in FIG. 1, the fins 132 extend vertically along the outer casing 106. It will be understood, however, that in other embodiments the fins 132 may extend horizontally or at an angle without departing from the scope of the present disclosure.

Typically, during operation, air surrounding the outer casing may aid in dissipating the heat from the fins or any other surfaces of the outer casing, generally, by convention. Moreover, air surrounding a lower portion of the outer casing may receive the heat dissipated by the outer casing. The warmed air rises adjacent to the outer casing forming streams of air rising due to natural convection. As the air rises adjacent to the outer casing, air tends to receive more heat dissipated from upper portions of the outer casing. Consequently, the temperature of the air may increase and its ability to receive more heat may reduce, thereby reducing the effectiveness of air as a cooling media for the enclosure.

Artificial cooling mechanisms, such as fans, heat exchangers, coolants, and cooling plates have been contemplated. However, recently, limits on the size of the enclosures have been mandated. These restrictions on the size of the enclosure, while allowing enclosures to be universally manufactured, set limits on the size and design considerations of the enclosures. Furthermore, because of the size limitations, use of large and bulky cooling devices, such as heat exchangers, fans, cooling plates, and coolants may not be feasible. Moreover, some of these bulky cooling devices may not be suitable for ruggedized applications. Therefore, embodiments of the present disclosure entail use of a small and light synthetic jet assembly to cool the enclosure 102. FIG. 1 illustrates an exemplary synthetic jet assembly 134 for dissipating heat from the enclosure 102. In one embodiment, the synthetic jet assembly 134 may be operatively coupled along the sidewall 128 of the enclosure 102. Moreover, the synthetic jet assembly 134 is coupled adjacent to the fins 132 to effectively dissipate heat from the fins 132.

Figure 2:
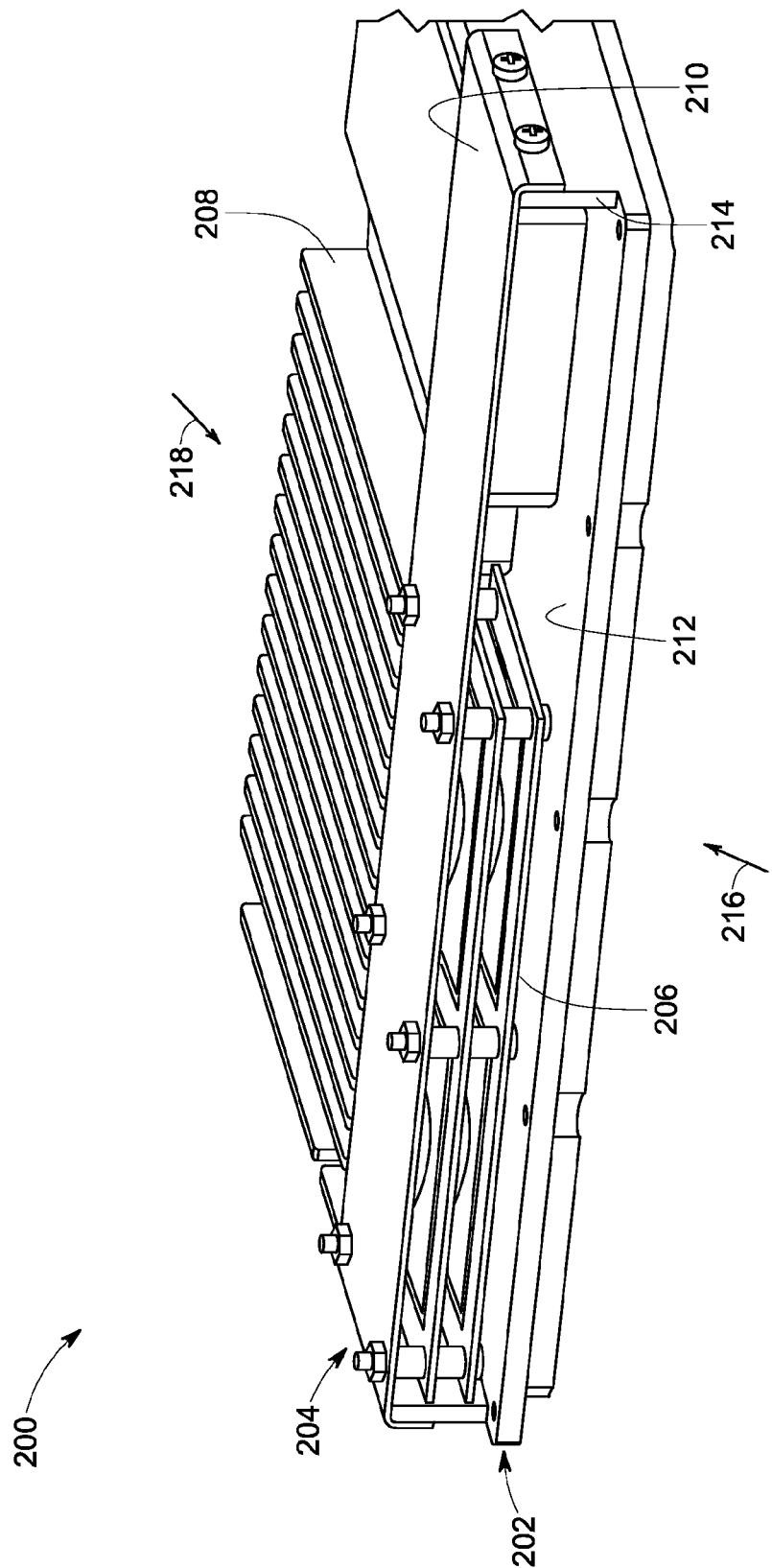
FIG. 2 is a perspective view of a portion of the enclosure of FIG. 1 illustrating the exemplary synthetic jet assembly, according to aspects of the present disclosure.

FIG. 2 is a perspective view 200 of a portion of the enclosure 102 of FIG. 1. In particular, FIG. 2 depicts a sidewall 202, representative of the sidewall 128 of the enclosure 102 and a synthetic jet assembly 204, representative of the synthetic jet assembly 134 of FIG. 1. Further, a nearside of the sidewall 202 is generally represented by the reference numeral 216 and a far side of the sidewall 202 is generally represented by the reference numeral 218. The synthetic jet assembly 204 may include one or more synthetic jets 206 that utilize air from their surroundings to create a fluid flow. More specifically, the synthetic jets 206 may be slender expandable devices with a port at one edge of the synthetic jets 206. It may be noted that in the illustrated embodiment of FIG. 2, the ports may not be visible as they may be located along the edges of the synthetic jets 206 towards the far side 218 of the sidewall 202. The synthetic jet 206 ingests a fluid, such as air or a dielectric liquid in one stroke and expends this fluid during a subsequent stroke through the port. Moreover, the port may expend the fluid at a high velocity, thereby creating an entrained airflow. The entrained airflow created by these synthetic jets 206 may force the fluid across the sidewall 202 at a rapid rate, thereby disrupting the thermal boundary layer and carrying heat away from the surface of the sidewall 202 quickly. Working of the synthetic jets 206 will be described in detail with reference to FIGS. 4A and 4B.

Although, in the illustrated embodiment of FIG. 2, the synthetic jet assembly 204 is shown as being operatively coupled to the sidewall 202, it will be appreciated that in other embodiments the synthetic jet assembly 204 may be coupled along one or more of the walls of the enclosure 102 of FIG. 1. For instance, the synthetic jet assembly 204 may be operatively coupled to the top wall 122, the bottom wall, 124, the back wall 126, or the sidewalls 128, 130 without departing from the scope of the present disclosure.

In the presently illustrated embodiment of FIG. 2, fins 208, such as the fins 132 of FIG. 1 may be disposed along at least a portion of the sidewall 202, such that the fins 208 extend along the portion of the sidewall 202. In other embodiments, the fins 208 may extend along a shorter portion of the sidewall 202 or along the entire surface area of the sidewall 202. In yet another embodiment, the fins 208 may be absent from the outer casing 106. In case the fins 208 extend along the entire surface of the sidewall 202, the synthetic jet assembly 204 may be disposed over the fins 208 and/or at an angle to the plane of the fins 208. Angular placement may allow the synthetic jets 206 to release jets of fluid at an angle to the surface of the fins 208. Moreover, in case the fins 208 are absent, the synthetic jet assembly 204 may be coupled along any portion of the sidewall 202 without departing from the scope of the present disclosure.

The orientation of the fins 208 may also vary. For instance, in one embodiment, the fins 208 may extend vertically along a portion of the sidewall 202. Here, the synthetic jet assembly 204 may be coupled to the sidewall 202 such that the synthetic jets 206 are aligned along the plane of the fins 208. Moreover, the ports of the synthetic jets 206 may be aligned along the plane of the fins 208 such that the fluid flow generated by the synthetic jets 206 may pass between the fins 208 during operation. In another embodiment, the fins 208 may extend horizontally or at an angle along a portion of the sidewall 202. In this case, the synthetic jet assembly 204 may be coupled to the sidewall 202 such that the synthetic jets 206 are aligned along the plane of the fins 208. However, the fluid flow generated by the synthetic jets 206 may pass across the fins 208 instead of through the fins 208.

The synthetic jet assembly 204 may further include a bracket 210, which may be employed to operatively couple the synthetic jets 206 to the sidewall 202. The bracket 210 may be coupled to the sidewall 202 such that the synthetic jets 206 are positioned between an outer surface 212 of the sidewall 202 and the bracket 210. Accordingly, as depicted in FIG. 2, the synthetic jets 206 may be coupled to the bracket 210 and the bracket 210 in turn may be coupled to the sidewall 202. With such an arrangement, the synthetic jets 206 may be indirectly coupled to the sidewall 202 instead of being directly coupled to the sidewall 202. In particular, there exists a separation between the synthetic jets 206 and the sidewall 202. This separation aids in isolating any vibrations experienced by the sidewall 202 from the synthetic jet assembly 204 and vice-versa.

Furthermore, the synthetic jet assembly 204 may be coupled to the bracket 210 such that the synthetic jet assembly 204 is substantially parallel to or disposed at an angle to the bracket 210. Alternatively, the bracket 210 may be coupled to the sidewall 202 such that the bracket 210 is substantially parallel to or disposed at an angle to the sidewall 202. With such an arrangement, the ports of the synthetic jets 206 may be configured to direct the fluid flow substantially parallel to the surface of the sidewall 202 or at an angle to the surface of the sidewall 202. Moreover, the synthetic jets 206 or the bracket 210 may be rotatably coupled the bracket 210 or the sidewall 202, respectively. Such rotatable coupling may allow variation of the angle of the synthetic jets 206 with respect to the sidewall 202, during operation. The variation of the angle of the synthetic jets 206 may be automatically managed by a computing device. Alternatively, the angle may be manually adjusted by an operator.

Moreover, in one embodiment, the synthetic jet assembly 204 may be positioned adjacent to the outer surface 212 of the sidewall 202. More particularly, the synthetic jets 206 may be spaced-apart from the outer surface 212 of the sidewall 202. Such a separation between the outer surface 212 of the sidewall 202 and the synthetic jets 206 increases the efficiency of the synthetic jet assembly 204. In particular, the separation between the synthetic jets 206 and the sidewall 202 prevents/minimizes any vibrations experienced by the sidewall 202 from being transferred to the synthetic jet assembly 204 or vice-versa. For example, if the aircraft 101 (see FIG. 1) undergoes mild turbulence mid-flight, the turbulence may carry to the enclosure 102 (see FIG. 1), thereby vibrating the sidewall 202. In accordance with embodiments of the present disclosure, since the synthetic jets 206 are spaced-apart from the outer casing 106, vibrations experienced by the sidewall 202 may not carry to the synthetic jets 206. These vibrations may damage the synthetic jets 206 or affect their operation. Therefore, by spacing-apart the synthetic jets 206 from the outer surface 212 of the sidewall 202, such vibrations may be reduced or eliminated, thereby preventing any damage to the synthetic jets 206.

In accordance with aspects of the present disclosure, any number of synthetic jets 206 may be employed in the synthetic jet assembly 204. In a presently contemplated configuration of FIG. 2, a two-dimensional array of four synthetic jets 206 is depicted. In other embodiments, however, more or fewer synthetic jets 206 may be employed. For instance, a two-dimensional array of six synthetic jets 206 may be employed or a one-dimensional array of one or more synthetic jets 206 may be employed. Multi-dimensional arrays may also be contemplated within the scope of the present disclosure. Moreover, any number of synthetic jet assemblies 204 may be coupled to an enclosure, such as enclosure 102 of FIG. 1. For instance, one or more synthetic jet assemblies 204 may be coupled along two or more walls of the enclosure 102. Further, more than one synthetic jet assembly 204 may be coupled along the same wall without departing from the scope of the present disclosure.

In one embodiment, the number of synthetic jets 206 coupled to the bracket 210 may depend on a power rating of the electronic devices 112 disposed within the enclosure 102. By way of example, if the power rating of the electronic devices 112 within the enclosure 102 is high, a greater number of synthetic jets 206 may be used. However, if the power rating of the electronic devices 112 is low, a smaller number of synthetic jets 206 may be employed. In accordance with another aspect of the present disclosure, the number of synthetic jets 206 employed may depend on the size of the enclosure 102 or the environment. For example, if the enclosure 102 is relatively large, a greater number of synthetic jets 206 may be employed. In a similar fashion if the enclosure 102 is relatively small, a smaller number of synthetic jets 206 may be utilized. Similarly, if the enclosure 102 is disposed in or around a high temperature region of a vehicle, such as the aircraft 101, it may be desirable to use more synthetic jets 206. On the other hand, if the enclosure 102 is disposed in or around a low temperature region of the aircraft 101, less number of synthetic jets 206 may be used. Furthermore, the number of rows of synthetic jets 206 may also vary depending on the height of the fins 208. For example, if the fins 208 are of greater height, a greater number of rows of synthetic jets 206 may be utilized.

Further, the alignment of the ports may also be configured based on the desired application. For example, all the ports may be positioned in a substantially similar direction. Alternatively, the angle of orientation of the various ports may be varied. In yet another embodiment, the ports may be aligned in substantially opposite directions. In such a case, the synthetic jets 206 may dissipate heat from the sidewall 202 in two different directions.

In the illustrated embodiment of FIG. 2, the sidewall 202 may be designed such that a partially-enclosed space is formed on the outer surface 212 of the sidewall 202. In one instance, a front cover, such as the front cover 104 (see FIG. 1) and a back wall, such as the back wall 126 (see FIG. 1) may extend beyond the outer surface 212 of the sidewall 202. Alternatively, the sidewall 202 itself may be configured such that the sidewall 202 includes perpendicular aprons 214 at the edges of the sidewall 202. Such an arrangement results the partially-enclosed space being formed on the outer surface 212 of the sidewall 202. In case the partially-enclosed space is formed by the extended edges of the back wall 126 and the front cover 104, the bracket 210 may be coupled to the sidewall 202 such that the ends of the bracket 210 are coupled to the extended edges of the back wall 126 and the front cover 104. Alternatively, in case the sidewall 202 includes the perpendicular aprons 214, the bracket 210 may be coupled to the sidewall 202 such that the ends of the bracket 210 are coupled to the aprons 214. By utilizing either of these arrangements, the synthetic jets 206 may be disposed within the partially-enclosed space. In other embodiments, in the absence of the partially-enclosed space, the bracket 210 may be coupled to non-extending edges of the back wall 126 and the front cover 104. The configuration of the bracket 210 will be described in detail with respect to FIG. 3.

Figure 3:
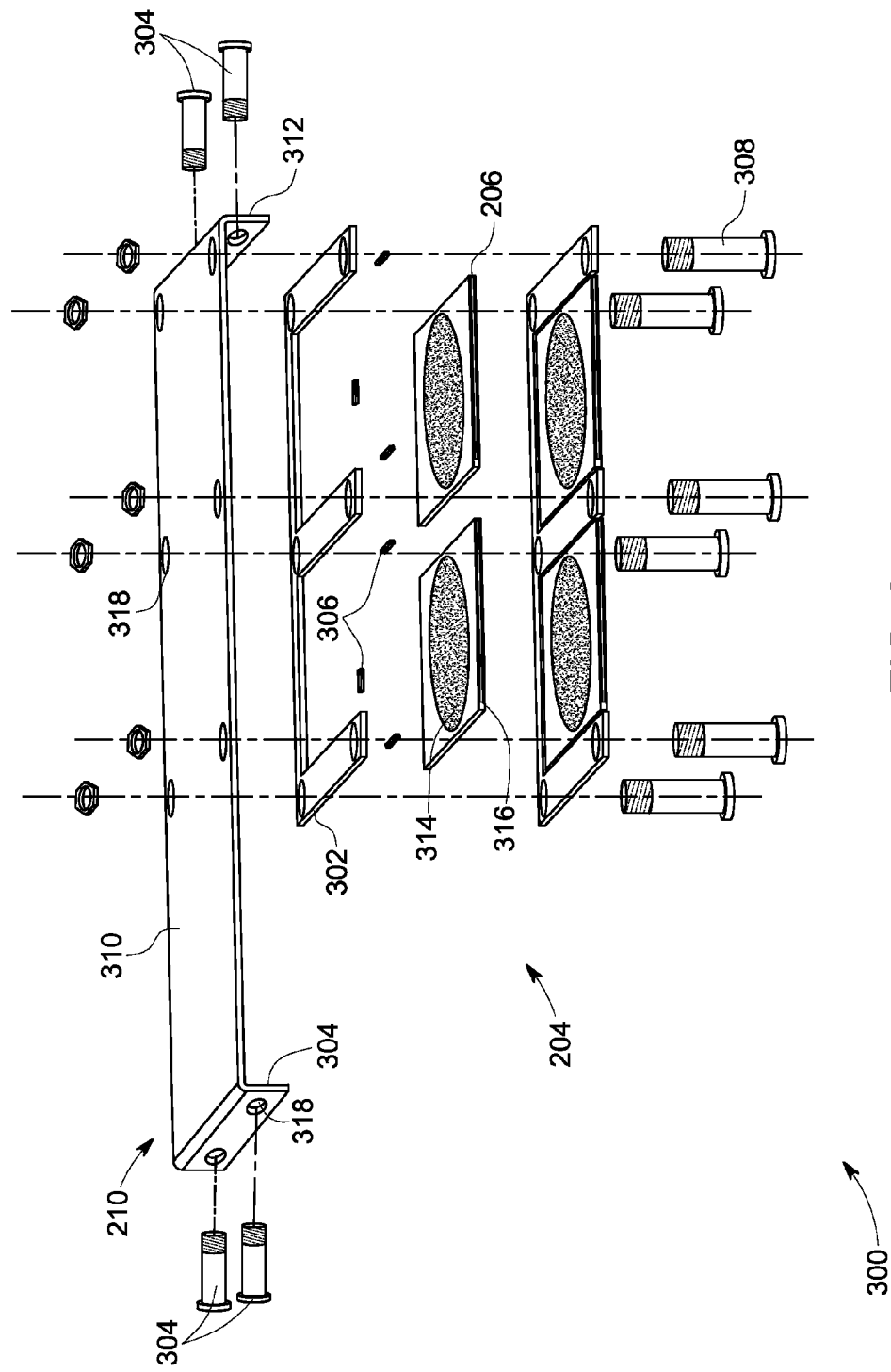
FIG. 3 is an exploded view of the exemplary synthetic jet assembly of FIG. 2, according to aspects of the present disclosure.

FIG. 3 is a diagrammatical representation of an exploded view 300 of the synthetic jet assembly 204 of FIG. 2. As depicted in FIG. 3, the synthetic jet assembly 204 may include the bracket 210, the synthetic jets 206, and a housing 302 for the synthetic jets 206. Further, the synthetic jet assembly 204 may also include securing means 304 to couple the synthetic jets to the housing 302, fasteners 306 to secure the housing 302 to the bracket 210, and fastening means 308 to secure the bracket 210 to the sidewall 202. Moreover, the bracket 210 may include a baseplate 310 and arms 312. Also, each synthetic jet 206 may include an actuator 314 and a port 316.

The arms 312 of the bracket 210 may extend perpendicularly from the baseplate 310 along two or more opposing edges of the baseplate 310. In the embodiment of FIG. 3, the bracket 210 is depicted as including a substantially rectangular baseplate 310 and two arms 312 extending from the two opposite short edges of the baseplate 310. It will be understood, however, that in different applications or embodiments, the size and shape of the bracket 210 may considerably vary. For example, the bracket 210 may have a substantially square baseplate, an elliptical baseplate, a circular baseplate, or other shaped baseplates. Further, the arms 312 may extend from any portion of the baseplate 310. For instance, in some embodiments, the arms 312 may extend along the length of the baseplate 310, along adjacent edges of the baseplate 310, or along any portion of the circumference of the baseplate 310 (in case of a circular or semi-circular baseplates). Additionally, in some embodiments, the arms 312 may extend from three sides of the baseplate 310. Alternatively, in case of elliptical or circular baseplates, the arms 312 may extend along a major portion of the circumference. The ports 316 of the synthetic jets 206 may be positioned in an area where the arms 312 are absent. For example, in case the arms 312 extend along three edges of the baseplate 310, the synthetic jets 206 may be coupled such that their ports 316 are aligned with a fourth edge of the baseplate 310.

Furthermore, the length of the arms 312 may be based on the configuration of the sidewall 202 or the number and/or arrangement of the synthetic jets 206. For instance, if the sidewall 202 includes the partially-enclosed space (see FIG. 2), the length of the arms 312 may be shorter than in instances when the sidewall 202 does not have the partially-enclosed space. Moreover, if a large number of rows of synthetic jets 206 are employed, the arms 312 may be longer than if fewer rows of synthetic jets 206 are employed. Furthermore, it will be understood that the length of the arms 312 may depend on a combination of the enclosure configuration and the arrangement of synthetic jets 206 without departing from the scope of the present disclosure.

In addition, to couple the bracket 210 to the sidewall 202, the arms 312 may be secured to the two walls of the enclosure 102 adjacent to the sidewall 202 (representative of sidewall 128 of FIG. 1). In FIG. 1, the synthetic jet assembly 134 is illustratively depicted as being coupled to the sidewall 128. In such an embodiment, the arms 312 of the bracket 210 may be coupled to the front cover 104 and the back wall 126 of the enclosure 102. Similarly, in case the synthetic jet assembly 134 is coupled to the back wall 126, the arms 312 of the bracket 210 may be coupled to the two sidewalls 128, 130 of the enclosure 102. In case the sidewall 202 includes the aprons 214, the arms 312 may be coupled to the aprons 214.

Fastening means 308, such as screws, bolts, washers, damping elements, luer-locks, glue, or welding may be employed to secure the arms 312 of the bracket 210 to the adjacent walls of the sidewall 202 or the aprons 214 of the sidewall 202. In the illustrated embodiment of FIG. 3, two sets of screws are employed as the fastening means 308 to secure the arms 312 to the adjacent walls or the aprons 214. Suitable apertures 318 may be formed in the arms 312 and the enclosure 102 for such fastening and securing.

Moreover, the synthetic jets 206 may be operatively coupled to the housing 302. The housing 302 may have various shapes or sizes without departing from the scope of the present disclosure. For instance, each synthetic jet 206 may have an individual housing 302. In other instances, two synthetic jets 206 may share the same housing 302. Alternatively, the same housing 302 may incorporate multiple synthetic jets 206 arranged in a row. In the illustrated embodiment of FIG. 3, one housing 302 receives both the synthetic jets 206 of one row. For such an arrangement, the housing 302 may be configured as, but not limited to, an E-shaped plate. The synthetic jets 206 may be disposed in the hollow sections of the housing 302 such that their ports 316 extend outward from the hollow sections of the housing 302. In another embodiment, in case a single synthetic jet 206 is utilized per housing 302, the housing 302 may be configured as a U-shaped plate, with the synthetic jet 206 disposed within the hollow space in the plate. In yet another embodiment, a multitude of synthetic jets may be configured in a line-shaped housing. Two two-jet E-shaped housings 302 are illustrated in FIG. 3. However, it will be appreciated that fewer or greater number of housings 302 may be employed in the synthetic jet assembly 204 without departing from the scope of the present disclosure.

Various forms of securing means 304 may be employed to secure the synthetic jets 206 to the housing 302. In the illustrated embodiment, three clippers are employed per synthetic jet 206 to couple the synthetic jet 206 to the housing 302. However, it will be appreciated that fewer or more clippers may be employed without departing from the scope of the present disclosure. Moreover, other securing means 304 such as bolts, screws, glues, welds, snap-fit nuts, double ended bolts, washers, and the like, may be employed. In one embodiment, the securing means 304 may be formed of a resilient or shock-absorbing material that may be configured to aid in dampening any vibrations experienced by the synthetic jet assembly 134 and/or the enclosure 102 (see FIG. 1).

With continuing reference to FIG. 3, the housing 302 may be coupled to the bracket 210 using any commonly known coupling mechanism. For example, the housing 302 may be coupled temporarily or permanently to the bracket 210. Temporary coupling means include fasteners 306 such as screws or bolts. Permanent coupling means may include welding, machine forming, or any other such means. In some embodiments, the fasteners 306 may be formed of a resilient or pliable material such as plastic, spring coils, or rubber. Alternatively, any vibration-absorbing material may be utilized without departing from the scope of the present disclosure. Moreover, the housing 302 may include grooves or apertures 318. Fasteners 306, such as screws or bolts may be passed through the apertures 318 in the housing 302 and the baseplate 310 to fasten the housing 302 to the bracket 210. In case the fastener 306 is a screw, the apertures 318 may include helical threads to receive and engage the threads of the screws. It will be understood that various fasteners 306 are widely known in the art and any of these means may be employed to securely fasten the housing 302 to the bracket 210 without departing from the scope of the present disclosure. For instance, in another embodiment, the bracket 210 may include protrusions (not shown) extending downward from the baseplate 310. These protrusions may mate with the apertures 318 in the housing 302 in a snap-fit arrangement to mechanically couple the housing 302 and the bracket 210.

Further, to maintain a gap between the two housings 302 depicted in FIG. 3, between the housings 302 and the bracket 210, and between the housings 302 and the outer surface 212 of the sidewall 202, stoppers (not shown) may be employed between the various layers. In one embodiment, the stoppers may be mounted around the fasteners 306. Moreover, the stoppers may be formed of pliant or shock-absorbing material to dampen vibrations. Alternatively, the stoppers may be formed of any other known material without departing from the scope of the present disclosure.

As previously described, any number of synthetic jets 206 may be coupled to the bracket 210. FIGS. 2 and 3 illustrate four synthetic jets arranged in a two-dimensional array. However, it will be understood that fewer or more number of synthetic jets 206 may be coupled in a one-dimensional, two dimensional, or multi-dimensional array without departing from the scope of the present disclosure. For instance, the synthetic jet assembly 204 may include a 3×2 array of six synthetic jets 206. Alternatively, the synthetic jet assembly 204 may include a 1×2 array of two synthetic jets 206. Other examples may include a 1×3 array, a 1×1 array, or a 2×6 array of synthetic jets 206, without departing from the scope of the present disclosure.

The actuator 314 of the synthetic jet 206 may be capable of creating periodic stress resulting from an electrical stimulus. The periodic stress may cause the port 316 of the synthetic jets 206 to open and close periodically. Accordingly, in one embodiment, the actuator 314 may include an oscillating diaphragm. A power supply may be coupled to the oscillating diaphragm such that the diaphragm oscillates with application of electric power. As the diaphragm oscillates outwards, fluid may be ingested into the synthetic jet 206 and as the diaphragm oscillates inwards, the fluid may exit the synthetic jet 206. The electric power for the actuator 314 may be provided from a power supply within the enclosure 102 or from an external power supply. In the illustrated embodiment of FIG. 3, the actuator 314 is illustrated as including two circular plates on opposite surfaces of the synthetic jet 206. It should be noted that the locations of the actuator 314 on the synthetic jets 206 shown in the figures are purely illustrative, and the disclosure is not limited to any specific locations of actuators 314. Moreover, although the actuator 314 is illustrated as circular plates in the embodiment of FIG. 3, in other cases the actuator 314 may be coextensive with the surfaces of the synthetic jets 206 or have other shapes. Furthermore, the actuator 314 may take the form of a single continuous portion. Alternatively, multiple discontinuous portions of the actuator 314 may be employed to actuate respective surfaces of the synthetic jets 206.

Examples of suitable materials for the actuators 314 include piezoelectric materials, magnetostrictive materials (magnetic fields from coils attract/oppose one another), or shape-memory alloys. In certain piezoelectric materials, a suitable actuator material may include bimorph piezoelectric configurations, where two piezo layers are energized out of phase to produce bending. In addition, the piezoelectric materials may include other configurations, where one piezo layer is disposed on a pre-stressed stainless steel shim or buzzer element configurations, where one piezo layer is disposed on a brass shim. In another embodiment, the actuator material may incorporate a ceramic material.

During operation, the synthetic jets 206 may be configured to direct a flow of fluid through the port 316. For this action, the actuator 314 may be configured to vibrate under the influence of a piezoelectric effect between two phases—compression and expansion during which the port opens and closes, respectively. The operation of the synthetic jets 206 may be better understood with reference to FIGS. 4A and 4B.

Figure 4A:
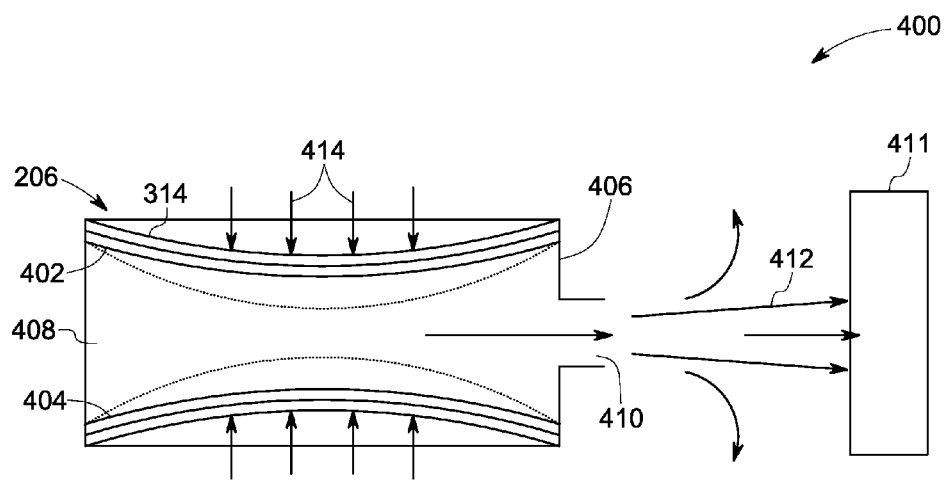
FIG. 4A is a cross-sectional view of the synthetic jet assembly of FIG. 3 during a compression or expulsion phase, according to aspects of the present disclosure.
Figure 4B:
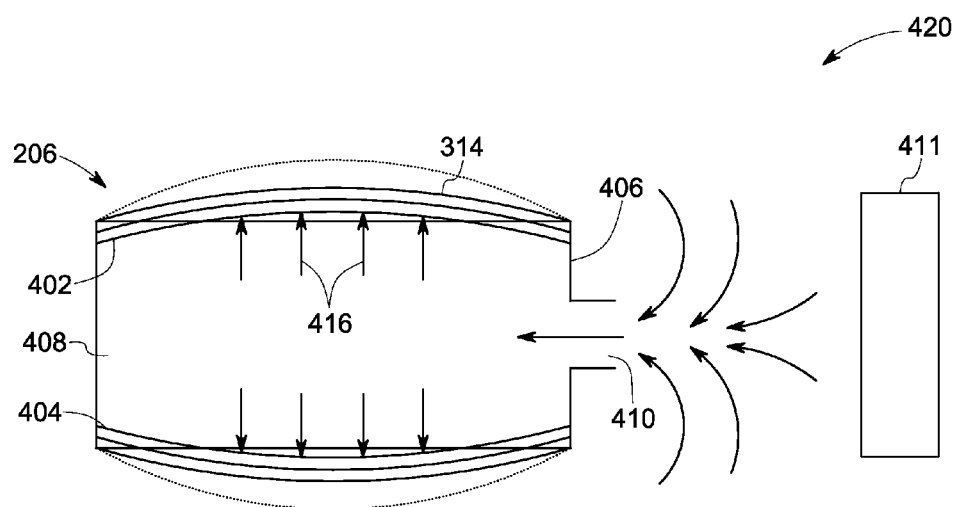
FIG. 4B is a cross-sectional view of the synthetic jet assembly of FIG. 3 during an expansion or ingestion phase, according to aspects of the present disclosure.

FIG. 4A is a cross-sectional view 400 of a synthetic jet, such as the synthetic jet 206 of FIGS. 2 and 3, in accordance with an exemplary embodiment of the present disclosure during a compression or expulsion phase. FIG. 4B is a cross-sectional view 420 of the synthetic jet during an expansion or ingestion phase. As shown, for example, in FIGS. 4A and 4B, the synthetic jet 206 includes a first flexible structure 402 and a second flexible structure 404. At least one actuator 314 may be coupled to at least one of the first and second flexible structures 402, 404. In addition, a compliant wall 406 may be positioned between the first and second flexible structures 402, 404 to define a chamber 408. The compliant wall 406 may include a port 410, such as the port 316 of FIG. 3 for facilitating fluid communication between a chamber 408 and an ambient environment. Moreover, a surface 411 representative of the sidewall 202 or the fins 208 (see FIG. 2) is disposed adjacent the port 410 of the synthetic jet 206. Fluid flow from the synthetic jet 206 may be employed to cool the surface 411 during operation.

To start operation, a small amount of electrical power is drawn by the piezoelectric actuator 314 causing the actuator 314 to vibrate. During a first phase of operation of the synthetic jet 206, shown in FIG. 4A, the actuator 314 may compress inwardly towards the chamber 408 (generally depicted by reference numeral 414) expelling the fluid out of the chamber 408 through the port 410. During a second phase of operation of synthetic jet 206, shown in FIG. 4B, the actuator 314 may expand outwardly away from the chamber 408 (generally depicted by reference numeral 416) drawing the fluid into the chamber 408 through the port 410. The actuator 314 may be designed such that the geometry of the actuator 214 permits the vibrating action to draw fluid through the port 410 and into the chamber 408 and then subsequently expel the fluid out of the chamber 408, again through the port 410. The physics of suction and expulsion through the port 410 may be different. When a fluid is drawn through the port 410, the port 410 may draw the fluid from an area all around the synthetic jet 206. Thus, most of the fluid volume drawn into the chamber 408 includes fluid from the area surrounding the port 410. When the synthetic jet 206 expels the fluid out of the port 410, a fluid jet 412 is formed. The fluid jet 412 may be configured such that vortex rings are formed in the fluid jet 412. A vortex ring is a region of rotating fluid moving through the same or different fluid where the flow pattern typically takes on a toroid (doughnut) shape. More specifically, vortex rings are formed by pushing the fluid jet 412 into a mass of stationary fluid. These vortex rings aid in disrupting a laminar film that may form along a natural convective flow cooled surface. The fluid jet 412 travels at a high velocity and entrains additional fluid from the surroundings, thereby enhancing the cooling performance.

Furthermore, the fluid jet 412 may be directed in a various ways. For instance, the fluid jet 412 may be directed such that the fluid jet 412 is substantially perpendicular to the surface 411. Such a direction tends to provide additional local cooling to the area of the surface 411 towards which the fluid jet 412 is directed. In another example, the fluid jet 412 may be directed such that the fluid jet 412 is substantially parallel to the surface 411. In this case, the fluid jet 412 entrains additional fluid along the periphery of the fluid jet 412 to provide additional cooling capacity. Thus, the amount of fluid that cools the surface 411 includes not only the fluid expelled from the chamber 408, but also the fluid that is entrained by the fluid jet 412.

Figure 5:
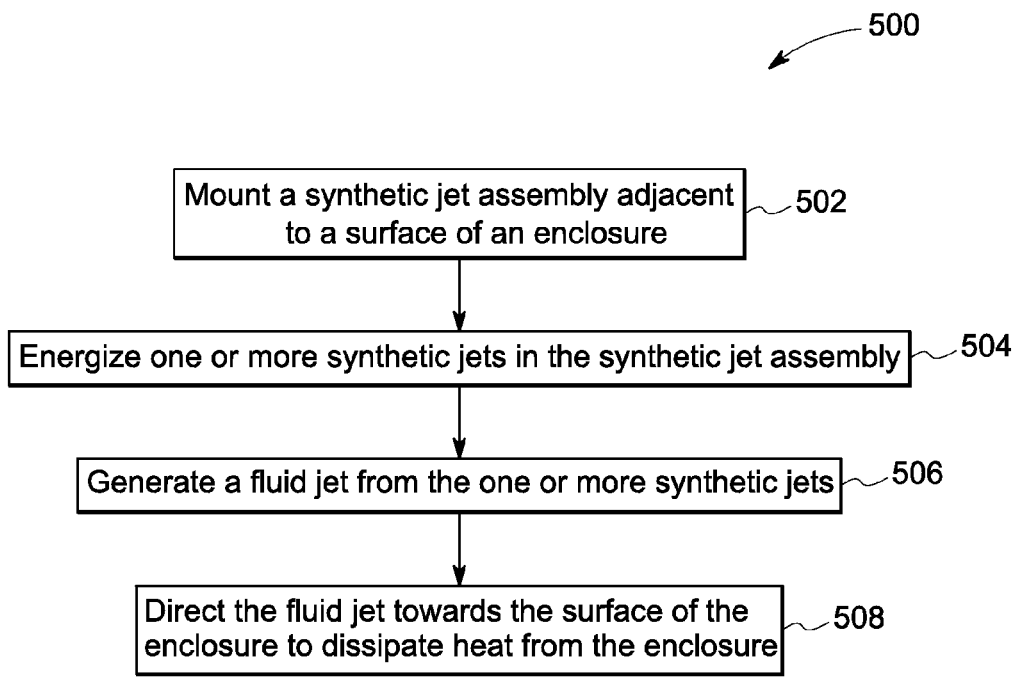
FIG. 5 is a flow chart illustrating an exemplary method for cooling an enclosure, according to aspects of the present disclosure.

FIG. 5 is a flowchart 500 illustrating an exemplary method for dissipating heat from an enclosure. The method will be described with respect to FIGS. 1-4. The method begins at step 502 where a synthetic jet assembly, such as the synthetic jet assembly 204 of FIG. 2, is operatively coupled along a sidewall, such as the sidewall 202, of an enclosure, such as the enclosure 102. As described previously with respect to FIGS. 1-3, one or more synthetic jet assemblies 204 may be operatively coupled to one or more sidewalls 202. Moreover, each synthetic jet assembly 204 may include one or more synthetic jets 206. In some embodiments, a two-dimensional arrangement of two or more synthetic jets 206 may be employed. In other embodiments, one or multi-dimensional array arrangements may be employed. Further, the synthetic jets 206 may be operatively coupled to the sidewall 202 such that they are spaced-apart from the surface of the sidewall 202.

Subsequently, the synthetic jet assembly 204 may be energized, as indicated by step 504. At step 506, the synthetic jets 206 may be configured to generate a fluid jet 412. To this end, the actuator 314 within the synthetic jet 206 may oscillate in response to the applied electric power. Because of the oscillations, the synthetic jet 206 may switch between two strokes—compression and expansion. During the expansion stroke, the actuator 314 may be configured to oscillate away from a chamber, such as the chamber 408, causing the chamber 408 to expand. Such an expansion may force a fluid such as air that surrounds the port 410 of the synthetic jet 206 to enter the chamber 408 within the synthetic jet. Subsequently, the actuator 314 may transition to the second stroke—the compression stroke. During this stroke, the actuator 314 may be configured to oscillate towards the chamber 408, thereby causing the chamber 408 to compress. Such compressive force forces the fluid present within the chamber 408 to exit the synthetic jet 206 at a very high velocity, thereby generating a fluid jet 412.

Subsequently, at step 508, the fluid jet 412 may be directed towards one or more walls of the enclosure 102 to dissipate the heat from the one or more walls. For instance, the fluid jet 412 may be employed to dissipate heat from the sidewall 202. To this end, the fluid jet 412 may be directed to flow over the surface of the sidewall 202, and receive heat from the sidewall 202. As the fluid jet 412 flows over the sidewall 202 at a high velocity, the fluid jet 412 dissipates the heat away from the sidewall 202 at a rapid rate, thereby cooling the sidewall 202 effectively.

In addition to effectively cooling enclosures, the synthetic jet assemblies described hereinabove may be utilized in other aviation applications, as the synthetic jet assemblies have no moving parts. Because these assemblies do not include any bearings or other wearable parts, their lifespan is greater when compared to currently available thermal management systems. Moreover, because a separation is maintained between the synthetic jets of the present disclosure and the surface of the enclosure to be cooled, vibrations experienced by the enclosure may not be transferred to the synthetic jets and vice-versa.

While only certain features of the invention have been illustrated and described herein, many modifications and changes will occur to those skilled in the art. It is, therefore, to be understood that the appended claims are intended to cover all such modifications and changes as fall within the true spirit of the present disclosure.

The invention claimed is:

1. An enclosure, comprising:
an outer casing having one or more walls;
a synthetic jet assembly configured to dissipate heat from the one or more walls and comprising:
a bracket operatively coupled to the one or more walls of the outer casing; and
two or more synthetic jets operatively coupled to the bracket such that the two or more synthetic jets are spaced apart from a surface of the one or more walls of the outer casing, wherein the two or more synthetic jets are arranged in a multiple-planes array.

2. The enclosure of claim 1, further comprising one or more heat generating electronic devices.

3. The enclosure of claim 2, wherein a number of synthetic jets in the synthetic jet assembly is based on a power rating of the one or more heat generating electronic devices.

4. The enclosure of claim 1, wherein the outer casing further comprises an extended surface disposed on at least one of the one or more walls of the outer casing.

5. The enclosure of claim 4, wherein the two or more synthetic jets comprise a port through which a fluid is directed parallel to or at an angle to, or both parallel and at an angle to the one or more walls, the extended surface of the outer casing, or both the one or more walls and the extended surface of the outer casing.

6. A ruggedized enclosure, the enclosure comprising:
an outer casing having an outer surface and one or more walls and comprising:
an extended surface disposed on at least one of the one or more walls of the outer casing;
a synthetic jet multiple-planes assembly configured to dissipate heat from the extended surface, wherein the synthetic jet multiple-planes assembly is disposed adjacent to the extended surface, and comprising:
a bracket coupled to the at least one of the one or more walls;
one or more synthetic jets operatively coupled to the bracket such that the one or more synthetic jets are disposed adjacent to the outer surface of the outer casing and are spaced apart from the outer surface of the outer casing; and
a housing configured to operatively couple the one or more synthetic jets to the bracket.

7. The ruggedized enclosure of claim 6, wherein the one or more synthetic jets are coupled to the bracket such that the synthetic jets are disposed between the bracket and the outer surface of the outer casing.

8. The ruggedized enclosure of claim 6, wherein the one or more synthetic jets are arranged in a one-dimensional array, a multi-dimensional array, or a combination thereof.

9. The ruggedized enclosure of claim 6, wherein a number of synthetic jets in the synthetic jet assembly is based on at least one of a power rating of one or more electronic devices disposed within the ruggedized enclosure, a size of the ruggedized enclosure, a height of the extended surface, or a temperature or a velocity of air surrounding the ruggedized enclosure.

10. The ruggedized enclosure of claim 6, wherein the one or more synthetic jets comprise a port through which a fluid is directed parallel to or at an angle to the extended surface disposed on at least one of the one or more walls of the outer casing.

11. A synthetic jet multiple-planes assembly, comprising:
a bracket; and
two or more synthetic jets coupled to the bracket such that the two or more synthetic jets are spaced apart from an enclosure that is operatively coupled to the bracket, wherein the two or more synthetic jets are arranged in a multi-dimensional array.

12. The synthetic jet assembly of claim 11, wherein the two or more synthetic jets are disposed in a housing and coupled to the bracket via one or more resilient fasteners.

13. The synthetic jet assembly of claim 11, wherein each of the two or more synthetic jets comprises a port configured to ingest fluid during a first stroke of the synthetic jet and eject the fluid during a second stroke of the synthetic jet.

14. The synthetic jet assembly of claim 13, wherein the two or more synthetic jets comprise a piezoelectric actuator.

15. The synthetic jet assembly of claim 11, wherein the bracket comprises:
a base plate; and
at least two arms extending perpendicularly from opposing ends of the base plate, wherein the two arms of the bracket are coupled to the enclosure.

16. A method for dissipating heat from one or more walls of an enclosure, the method comprising:
mounting a synthetic jet multiple-planes assembly adjacent to an extended surface of the enclosure, wherein the synthetic jet assembly comprises:
a bracket operatively coupled to the enclosure;
one or more synthetic jets operatively coupled to the bracket such that the one or more synthetic jets are spaced apart from an outer surface of the enclosure;
generating a fluid jet from the one or more synthetic jets; and
directing the fluid jet towards the one or more walls of the enclosure to dissipate the heat from the one or more walls.

* * * * *